United States Patent
Yagi et al.

(10) Patent No.: US 9,497,805 B2
(45) Date of Patent: Nov. 15, 2016

(54) ORGANIC EL ELEMENT DRIVING DEVICE AND ORGANIC EL LIGHTING APPARATUS

(75) Inventors: Tsukasa Yagi, Tokyo (JP); Kouichi Ishida, Osaka (JP); Yuichi Iketsu, Tokyo (JP); Kouji Miyawaki, Tokyo (JP)

(73) Assignee: KONICA MINOLTA HOLDINGS, INC., Tokyo (JP)

( * ) Notice: Subject to any disclaimer, the term of this patent is extended or adjusted under 35 U.S.C. 154(b) by 562 days.

(21) Appl. No.: 13/703,088

(22) PCT Filed: Jun. 13, 2011

(86) PCT No.: PCT/JP2011/063495
§ 371 (c)(1),
(2), (4) Date: Dec. 10, 2012

(87) PCT Pub. No.: WO2011/158786
PCT Pub. Date: Dec. 22, 2011

(65) Prior Publication Data
US 2013/0088174 A1   Apr. 11, 2013

(30) Foreign Application Priority Data

Jun. 18, 2010   (JP) .................................. 2010-139127

(51) Int. Cl.
H05B 37/02 (2006.01)
H05B 33/08 (2006.01)
H01L 27/32 (2006.01)

(52) U.S. Cl.
CPC .......... H05B 33/08 (2013.01); H05B 33/0896 (2013.01); *H01L 27/3276* (2013.01); *Y02B 20/325* (2013.01)

(58) Field of Classification Search
CPC .......... H05B 33/0815; H05B 33/0896; H05B 33/0818; H05B 33/0827; H05B 33/0851; H05B 33/0824; Y02B 20/347; Y02B 20/346; Y02B 20/36; H01L 2251/5361; H01L 51/50
USPC ............ 315/209 R, 247, 291, 294, 297, 299, 315/307, 308, 312, 360
See application file for complete search history.

(56) References Cited

U.S. PATENT DOCUMENTS

2005/0007085 A1   1/2005   Murakami
2006/0232216 A1   10/2006   Kosaka
(Continued)

FOREIGN PATENT DOCUMENTS

JP   2005-033853 A   2/2005
JP   2005-078828 A   3/2005
(Continued)

OTHER PUBLICATIONS

International Search Report for International Application No. PCT/JP2011/063495 dated Sep. 13, 2011, 2 pages.

*Primary Examiner* — Thuy Vinh Tran
(74) *Attorney, Agent, or Firm* — Brinks, Gilson & Lione

(57) ABSTRACT

An organic EL element driving device that drives an organic EL element with a constant current is provided. The organic EL element driving device includes a power supply connected in series with the organic EL element, and a current control unit connected in series with the organic EL element. The current control unit includes a current detection circuit having a resistor for detecting the value of the current passing through the organic EL element. The current control unit sets a prescribed value for the current to be passed through the organic EL element in accordance with the luminance control, and performs control such that the current passing through the organic EL element has the prescribed value in accordance with an output from the current detection circuit. A value of the resistor in the current detection circuit is varied in accordance with the luminance control.

14 Claims, 7 Drawing Sheets

(56) References Cited

U.S. PATENT DOCUMENTS

| | | | |
|---|---|---|---|
| 2008/0122383 A1 | 5/2008 | Katoh | |
| 2008/0129225 A1* | 6/2008 | Yamamoto et al. | 315/307 |
| 2009/0015759 A1* | 1/2009 | Honbo | 349/69 |
| 2010/0109537 A1* | 5/2010 | Nishino et al. | 315/185 R |
| 2010/0283773 A1* | 11/2010 | Kim | 345/211 |
| 2010/0301760 A1* | 12/2010 | Liu | 315/186 |
| 2010/0308749 A1* | 12/2010 | Liu | 315/307 |

FOREIGN PATENT DOCUMENTS

| | | |
|---|---|---|
| JP | 2005-116738 A | 4/2005 |
| JP | 2006-121774 A | 5/2006 |
| JP | 2006-303002 A | 11/2006 |
| JP | 2007-280559 A | 10/2007 |
| JP | 2008-134288 A | 6/2008 |
| JP | 2009-026544 A | 2/2009 |
| JP | 2009-261213 A | 11/2009 |

* cited by examiner

FIG.6 - PRIOR ART

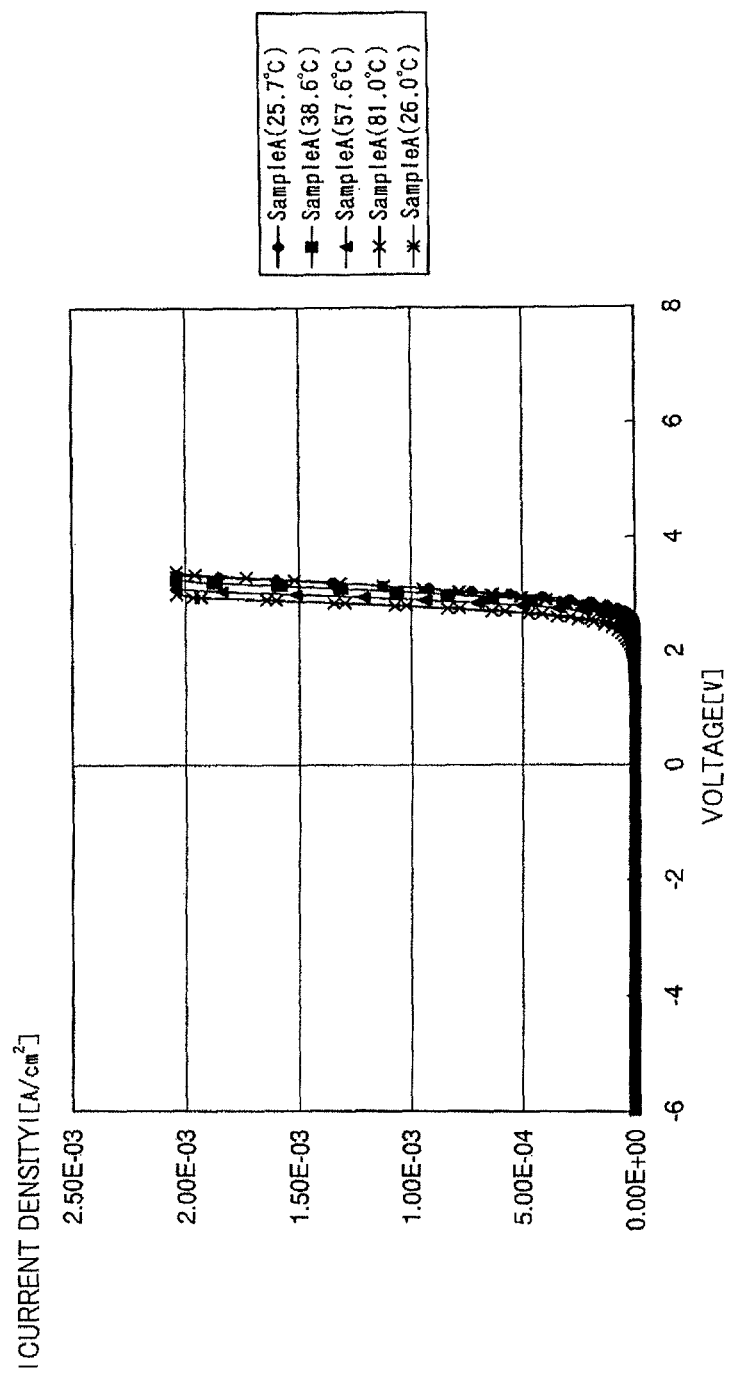
FIG. 7 - PRIOR ART

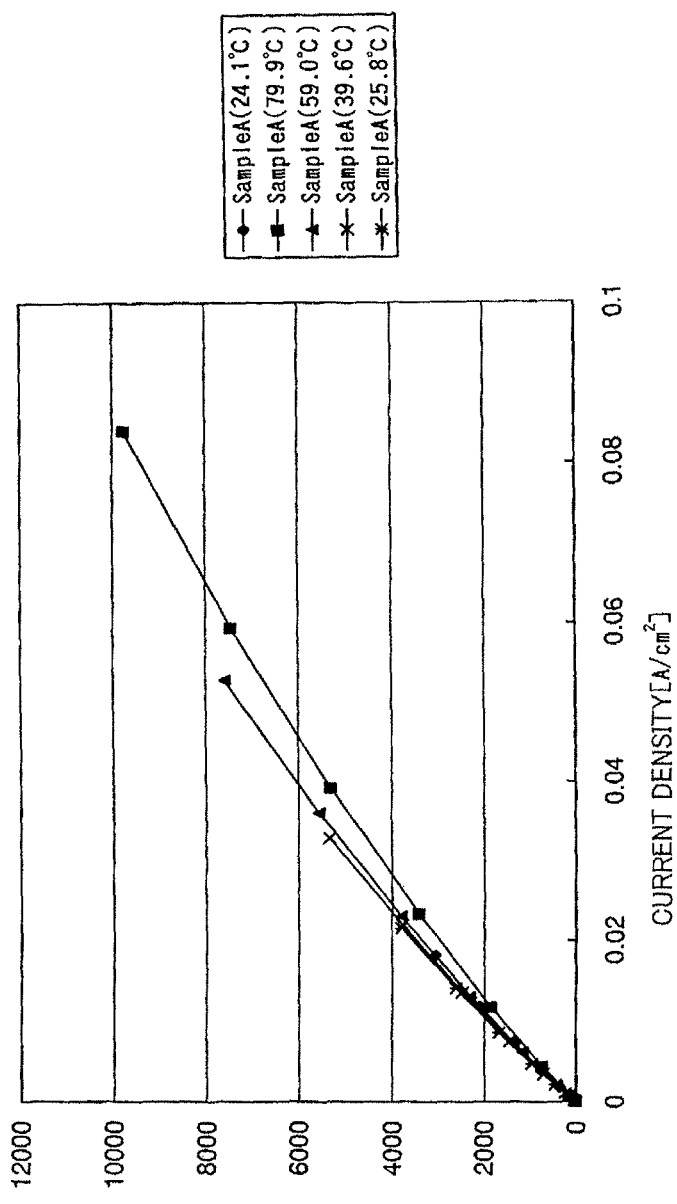
FIG.8 - PRIOR ART

FIG.9 - PRIOR ART
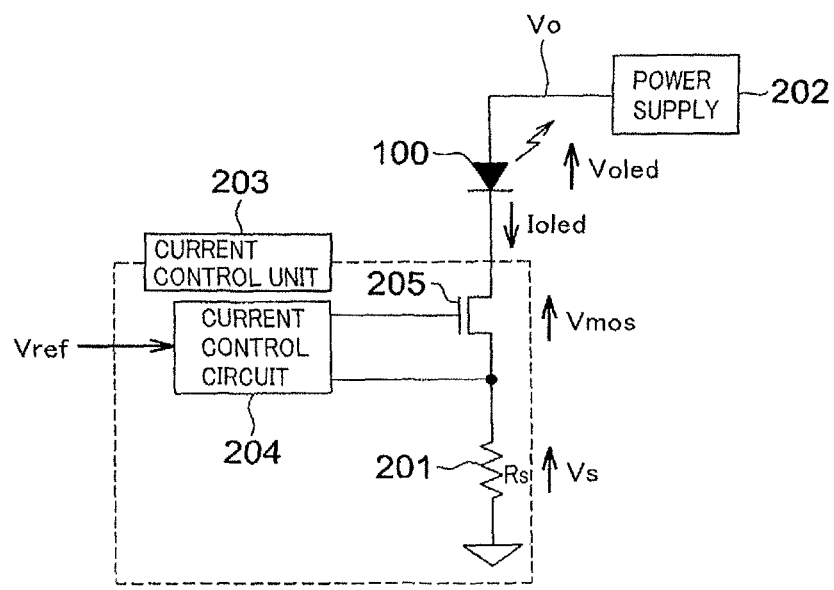

ORGANIC EL ELEMENT DRIVING DEVICE AND ORGANIC EL LIGHTING APPARATUS

This application is a National Stage application of International Application No. PCT/JP2011/063495, filed Jun. 13, 2011.

TECHNICAL FIELD

The present invention relates to an organic EL element driving device for driving an organic EL element, and an organic EL lighting apparatus.

BACKGROUND ART

Recent years have seen the acceleration of development of bulb-type fluorescent lamps and bulb-type LED (Light-Emitting Diode) lighting apparatuses which attain a high degree of energy savings in illumination. An organic EL (Electroluminescence) lighting apparatus which attains a similarly high degree of energy savings is a surface-emitting light source, and has advantageous properties of being thin, lightweight and flexible. With such properties, organic EL provides new illumination designs, showcases and showrooms conventionally unattainable, and allows new presentations at a store and the like. The development of organic EL has also been promoted since it is environmentally friendly in that it is mercury-free.

FIG. 6 is a schematic diagram showing the cross-sectional structure of a common organic EL element 100. As shown in FIG. 6, organic EL element 100 includes ITO 101, an organic EL layer 102 and an aluminum layer 103, which are stacked on a base member 104. Organic EL element 100 is configured such that a direct-current voltage is applied between aluminum layer 103 and ITO 101.

The light emission principle of an organic EL element is to pass a current through an extremely thin film having a transparent conductive film (anode), an organic EL material and a metal electrode (cathode) stacked on a substrate, to produce recoupling of electrons and holes in the organic EL material to thereby generate light.

FIG. 7 is a graph showing an example of current-voltage characteristics, which represent a relationship between voltage and current density of organic EL element 100 for each temperature. FIG. 8 is a graph showing an example of a relationship between current density and luminance of organic EL element 100 for each temperature.

As shown in FIG. 7, the current-voltage characteristics of organic EL element 100 are similar to the current-voltage characteristics of a diode. Namely, there is very little current flow at a low voltage, and then a current flows abruptly when a certain threshold voltage is reached. Furthermore, as can be seen from FIG. 7, when the current density is measured with the temperature varying from a room temperature of 26.0 degrees to 81.0 degrees, the threshold voltage is shifted downward as the temperature increases, and when the voltage is constant, the current increases abruptly as the temperature varies. As shown in FIG. 8, on the other hand, the current density and the luminance have an approximately linear relationship, and exhibit relatively stable behavior with respect to temperature.

If organic EL element 100 exhibiting such behavior is driven by voltage control, a voltage value needs to be controlled with a very high degree of accuracy, and compensation for temperature needs to be made with a similarly high degree of accuracy. Furthermore, if organic EL element 100 is driven by voltage control, electro-optical conversion efficiency is significantly affected by a variation in threshold voltage during manufacture of organic EL element 100. For this reason, organic EL element 100 should be driven by current control to obtain a more stable luminance with respect to temperature variation and the like.

FIG. 9 is a block diagram of a common current driving device for driving organic EL element 100. Organic EL element 100 to be driven, a power supply 202 and a current control unit 203 are connected in series. Current control unit 203 includes a MOSFET (Metal Oxide Semiconductor Field Effect Transistor) 205, a current control circuit 204 and a current detection resistor 201.

Current control unit 203 measures a voltage Vs across current detection resistor 201 having a resistance value Rs, in order to pass a constant current Ioled through organic EL element 100 by using current control circuit 204. Current control unit 203 compares measured voltage Vs with a reference voltage Vref, and controls a gate voltage of MOSFET 205 in response to a signal from the current control circuit to satisfy voltage Vs=reference voltage Vref, to vary a current passing through MOSFET 205. When Vref=Vs is satisfied, current Ioled passing through organic EL element 100 is obtained by an equation below.

$$Ioled = Vref/Rs$$

As can be seen from this equation, current Ioled can be varied by varying the value of Vref.

A voltage Vo supplied to organic EL element 100 from power supply 202 is the sum of a voltage drop Voled in organic EL element 100, a voltage drop Vmos in MOSFET 205, and a voltage drop Vs in current detection resistor 201. In reality, voltage Vo needs to be set to a sufficiently large value by taking into account a margin to adapt to the adjustment of luminance of organic EL element 100, a variation during a manufacturing stage, temperature characteristics, temporal variation and the like of organic EL element 100.

Power based on the voltage set to a sufficiently large value with a margin, however, becomes heat at MOSFET 205 and/or current detection resistor 201 and is consumed. That is, power based on this extra voltage is wasted without contributing to light emission.

In particular, when luminance adjustment for organic EL element 100, i.e., dimming needs to be performed, an approximately double-digit dimming range is required, which requires a double-digit range for current. During dimming, therefore, a voltage detected by current detection resistor 201 varies in double digits. Since power consumption is proportional to the square of voltage, double-digit variation in voltage causes four-digit variation in power, resulting in power wasted particularly in a low luminance region.

PTL 1 discloses a driving device including a group of a plurality of light-emitting elements (light-emitting diodes) connected to a plurality of constant current supplies, respectively, in which switching control of a power supply circuit is performed such that the lowest one of dropped voltages of the constant current supplies is constant. It is stated that, according to this technique of controlling the dropped voltage of the constant current supply to a constant value, a loss in voltage detection by detecting the resistance is not increased even if a current passing through the light-emitting diodes increases.

Japanese Laid-Open Patent Publication No. 2008-134288 (PTL 2) discloses an LED driver for supplying power to an LED, which includes a constant current circuit unit connected in series with the LED for adjusting a current passing itself to a prescribed value, and a voltage regulation unit connected in series with the constant current circuit unit for regulating the voltage by way of a switching regulator. It is stated that, according to this LED driver of regulating the voltage by the switching regulator, waste of power consumption involved with a voltage drop process can be minimized.

CITATION LIST

Patent Literature

PTL 1: Japanese Laid-Open Patent Publication No. 2005-033853
PTL 2: Japanese Laid-Open Patent Publication No. 2008-134288

SUMMARY OF INVENTION

Technical Problem

In the techniques described in PTLs 1 and 2, however, a circuit constant of the resistor and the like in the current control unit described above is considered to be not variable but set to a constant value. Accordingly, when a current detection resistor adaptable to a low luminance region is used, power consumption is wasted in the current control unit in a high luminance region.

In view of the above, the present invention provides an organic EL element driving device and an organic EL lighting apparatus capable of achieving more energy savings than conventional technique.

Solution to Problem

According to an aspect of the present invention, an organic EL element driving device that drives an organic EL element with a constant current and is capable of varying a value of the constant current in accordance with luminance control is provided. The organic EL element driving device includes a power supply connected in series with the organic EL element, and a current control unit connected in series with the organic EL element. The current control unit includes a current detection circuit having a resistor for detecting the value of the current passing through the organic EL element. The current control unit sets a prescribed value for the current to be passed through the organic EL element in accordance with the luminance control, and performs control such that the current passing through the organic EL element has the prescribed value in accordance with an output from the current detection circuit. A value of the resistor in the current detection circuit is varied in accordance with the luminance control.

An organic EL lighting apparatus according to another aspect of the present invention includes an organic EL element, and an organic EL element driving device that drives the organic EL element with a constant current and is capable of varying a value of the constant current in accordance with luminance control. The organic EL element driving device includes a power supply connected in series with the organic EL element, and a current control unit connected in series with the organic EL element. The current control unit includes a current detection circuit having a resistor for detecting the value of the current passing through the organic EL element. The current control unit sets a prescribed value for the current to be passed through the organic EL element in accordance with the luminance control, and performs control such that the current passing through the organic EL element has the prescribed value in accordance with an output from the current detection circuit. A value of the resistor in the current detection circuit is varied in accordance with the luminance control.

Advantageous Effects of Invention

According to the present invention, an organic EL element driving device and an organic EL lighting apparatus capable of achieving more energy savings than conventional technique can be provided.

BRIEF DESCRIPTION OF DRAWINGS

FIG. 6 is a schematic diagram showing the cross-sectional structure of a common organic EL element.
FIG. 7 is a graph showing an example of current-voltage characteristics, which represent a relationship between voltage and current density of the organic EL element for each temperature.
FIG. 8 is a graph showing an example of a relationship between current density and luminance of the organic EL element for each temperature.
FIG. 9 is a block diagram of a common current driving device for driving the organic EL element.

DESCRIPTION OF EMBODIMENTS

First Embodiment

A first embodiment of the present invention will be described with reference to the drawings. The present invention, however, is not limited to the embodiments described below.

Figure 1:
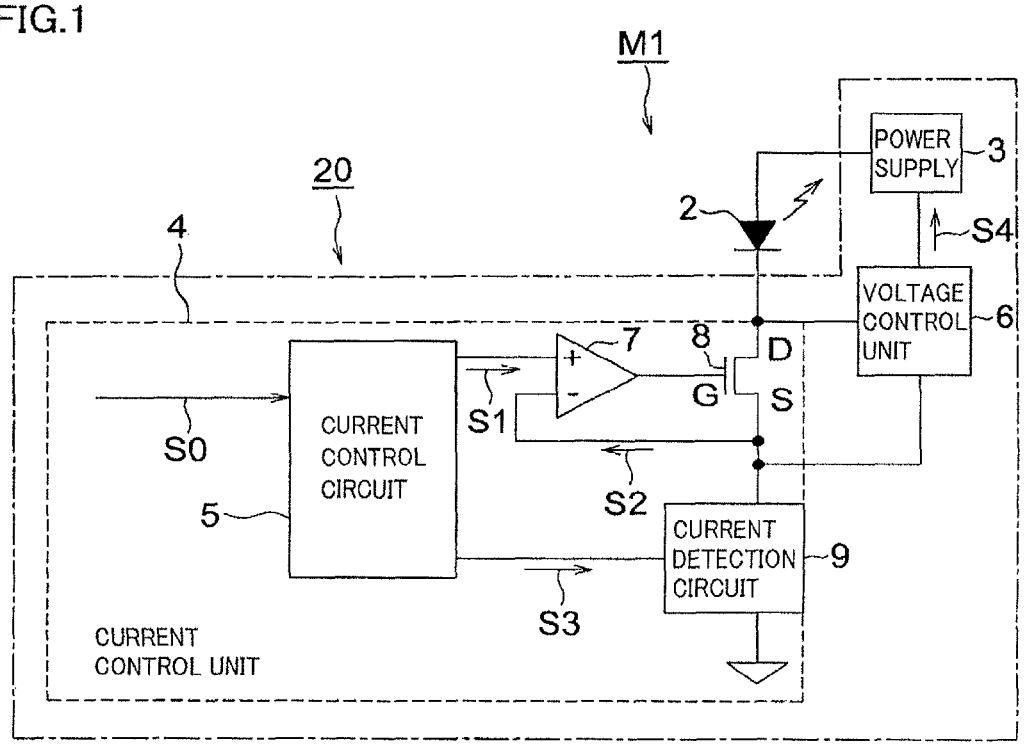
FIG. 1 shows the configuration of an organic EL lighting apparatus according to a first embodiment.

FIG. 1 shows the configuration of an organic EL lighting apparatus M1 according to the first embodiment. In this figure, a portion encircled with a chain-dotted line indicates an organic EL element driving device 20.

Organic EL lighting apparatus M1 includes an organic EL element 2, a power supply 3 and a current control unit 4 connected in series with organic EL element 2, and a voltage control unit 6. Organic EL element driving device 20 includes the portion of organic EL lighting apparatus M1 other than organic EL element 2, namely, power supply 3, current control unit 4 and voltage control unit 6. Organic EL element driving device 20 drives organic EL element 2 with a constant current.

Power supply 3 is a variable voltage source capable of varying an output voltage in response to a voltage control signal S4 from voltage control unit 6. That is, power supply 3 is a variable voltage source capable of varying an applied voltage to organic EL element 2. Voltage control unit 6 has the function of detecting a voltage across a drain D and a source S of a MOSFET 8 of current control unit 4, and controlling an output voltage from power supply 3. That is, voltage control unit 6 varies an applied voltage from power supply 3 in accordance with luminance control.

Organic EL element 2 has a structure similar to that illustrated in FIG. 6. While organic EL element 2 is represented as a single diode in FIG. 1, a plurality of organic EL elements may be connected in series. Organic EL element 2 is connected in series between a voltage output terminal of power supply 3 and current control unit 4.

Current control unit 4 includes a current control circuit 5, a differential amplifier 7, MOSFET 8 and a current detection circuit 9, and has the function of controlling the value of a current passing through organic EL element 2 to a prescribed constant value as will be described later.

Current detection circuit 9 includes a resistor for detecting the value of a current passing through organic EL element 2, and detects the current value based on a voltage drop that occurs in this resistor. Specifically, current detection circuit 9 includes a plurality of current detection resistors R in parallel for guiding a current passing through organic EL element 2. A voltage drop that occurs in a selected one of the plurality of current detection resistors R is detected, and based on a resistance value of and the voltage drop in the one of current detection resistors R, the value of a current passing through the one of current detection resistors R can be detected.

Current control circuit 5 controls MOSFET 8 via differential amplifier 7 based on the value of the current passing through organic EL element 2 that has been detected by current detection circuit 9, to control the value of the current passing through organic EL element 2. That is, MOSFET 8 is arranged between organic EL element 2 and current detection circuit 9, and controls the value of the current passing through organic EL element 2.

The luminance of organic EL element 2 is indicated by a luminance control signal S0 from outside. Luminance control signal S0 is input to current control circuit 5. The outside as used herein refers to a PC (Personal Computer), for example, and luminance control signal S0 is an analog output from a DA (Digital to Analog) terminal provided on the PC. Any device that outputs a signal for controlling luminance other than a PC can be employed.

Current control circuit 5 determines one of current detection resistors R having an optimal resistance value based on luminance control signal S0, and outputs a resistor switching signal S3 to current detection circuit 9. In response to resistor switching signal S3, current detection circuit 9 selects the one of current detection resistors R that has been determined by current control circuit 5, and guides the current from organic EL element 2 to the selected one of current detection resistors R.

In this embodiment, when controlling the value of a current passing through organic EL element 2, current detection circuit 9 detects the current value by detecting a voltage drop that occurs in one of current detection resistors R. In detecting the voltage drop in the one of current detection resistors R, a detectable limit of the voltage value, i.e., a detection limit exists.

In this embodiment, on the other hand, the value of a current passing through organic EL element 2 varies significantly as a result of performing the luminance adjustment (dimming) of organic EL element 2. In particular, if the value of the current passing through organic EL element 2 is increased, power consumption in current detection circuit 9, which is wasted without contributing to the luminance of organic EL element 2, is desired to be as low as possible.

Accordingly, if a voltage drop in current detection resistor R through which the current of organic EL element 2 passes is great as compared to the detection limit of voltage value, the voltage drop in current detection resistor R can be detected adequately. Therefore, the resistance value of current detection resistor R is desired to be smaller.

In this embodiment, therefore, when a current passing through organic EL element 2 has a small value, one of current detection resistors R having a higher resistance value is selected to guide the current passing through organic EL element 2 to the one of current detection resistors R. When a current passing through organic EL element 2 has a large value, one of current detection resistors R having a lower resistance value is selected to guide the current passing through organic EL element 2 to the one of current detection resistors R. As a result, a voltage drop larger than the detection limit of voltage value is secured, while power consumed in the one of current detection resistors R is reduced.

When adjusting the luminance of organic EL element 2, current control circuit 5 determines a current passing through organic EL element 2 by taking into account operations of all of organic EL element 2, MOSFET 8 and current detection circuit 9 to which a voltage is applied from power supply 3.

Figure 2:
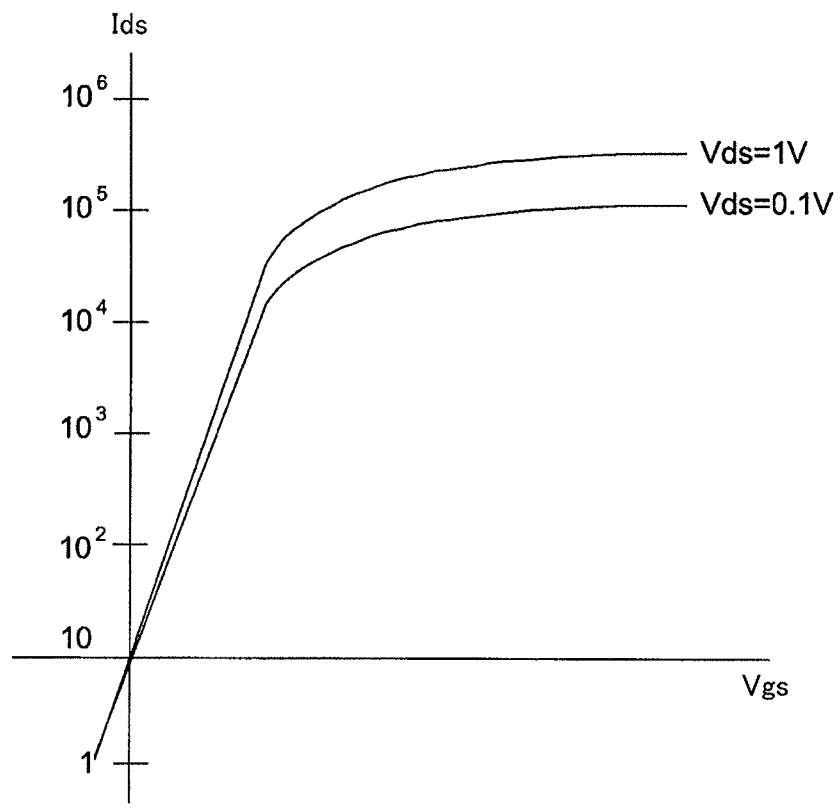
FIG. 2 is a graph showing current-voltage characteristics of a gate voltage Vgs and a drain-source current Ids, with a drain-source voltage Vds of a MOSFET as a parameter.

The current passing through organic EL element 2 is determined by controlling MOSFET 8. FIG. 2 is a graph showing current-voltage characteristics of a gate voltage Vgs and a drain D-source S current Ids, with a drain D-source S voltage Vds of MOSFET 8 as a parameter.

Gate voltage Vgs of MOSFET 8 has a threshold voltage Vth. A state where Vds<Vgs−Vth corresponds to a linear region, and a state where Vds>=Vgs−Vth corresponds to a saturation region. Ids varies as expressed by equations below for each region.

$$Vds<Vgs-Vth: \text{linear region}$$

$$Ids=K\times((Vgs-Vth)\times Vds-\tfrac{1}{2}\times Vds^2)$$

$$Vds>=Vgs-Vth: \text{saturation region}$$

$$Ids=\tfrac{1}{2}\times K\times(Vgs-Vth)^2\times(1+Vds)$$

Here, K represents a constant for each MOSFET. In order to minimize power consumption in MOSFET 8, each of Vds and Ids needs to be reduced. Since Ids is equal to Ioled, for MOSFET 8 having the current-voltage characteristics shown in FIG. 2, drain-source current Ids=Ioled such that organic EL element 2 attains a desired luminance can be passed by setting Vds to a minimum value, for example, 0.1 V, and controlling Vgs. While Vds is set to 0.1 V in this embodiment, an optimal value may be set depending on a transistor used.

To set Vgs of MOSFET 8 to the value thus determined, overall control is performed by taking into account how voltage Vo supplied to organic EL element 2 from power supply 3 is allocated among voltage drop Voled in organic EL element 2, voltage drop Vmos in MOSFET 8, and voltage drop Vs in current detection resistor R.

Specifically, current control circuit 5 determines a current value of organic EL element 2 in accordance with luminance control signal S0 indicating a voltage value, determines voltage drop Vs in current detection resistor R at that time as the product of the current value of organic EL element 2 and the resistance value of current detection resistor R, and outputs that voltage drop Vs as a luminance control signal S1 indicating a voltage value.

Differential amplifier 7 compares luminance control signal S1 with a current detection signal S2 indicating a voltage drop in current detection resistor R, and controls gate voltage Vgs of MOSFET 8 such that luminance control signal S1 becomes equal to current detection signal S2 in voltage. By making the voltage across current detection resistor R equal to S1 in this manner, the current passing through organic EL element 2 is set to a prescribed value. Luminance control signal S1 may be predetermined based on the luminance-current characteristics of organic EL element 2 and the value of current detection resistor R, stored in a not-shown storage unit, and retrieved from the storage unit by current control unit 4 in response to luminance control signal S0.

Differential amplifier 7 regulates gate voltage Vgs of MOSFET 8 such that luminance control signal S1 corresponds to current detection signal S2, by raising gate voltage Vgs when current detection signal S2 has a low voltage with respect to luminance control signal S1, and lowering gate voltage Vgs when current detection signal S2 has a high voltage. In parallel with this operation, voltage control unit 6 detects a drain D-source S voltage of MOSFET 8, and outputs voltage control signal S4 to power supply 3 such that this drain D-source S voltage has a value (e.g., 0.1V or 1V) predetermined in accordance with the characteristics of MOSFET 8. The specific configuration of voltage control unit 6 may be implemented by the known configuration as disclosed in Japanese Laid-Open Patent Publication No. 2005-033853 or Japanese Laid-Open Patent Publication No. 2008-134288 discussed above.

That is, in organic EL element driving device 20, the value of the constant current can be varied in accordance with the luminance control by luminance control signal S0. Current control unit 4 sets a prescribed value for the current to be passed through organic EL element 2 in accordance with the luminance control by luminance control signal S0, and performs control such that the current passing through organic EL element 2 has the prescribed value in accordance with an output from current detection circuit 9. Furthermore, values of the resistors in current detection circuit 9 are varied in accordance with the luminance control by luminance control signal S0.

By performing the control as described above, power consumed in current control unit 4 can be minimized while the accuracy of current detection in the current detection resistor is maintained.

Next, current control circuit 5 and current detection circuit 9 will be described in detail. Current control circuit 5 includes a microcontroller with an integral memory, for example, and stores a table from which one of current detection resistors R is selected in accordance with a value of input luminance control signal S0. Table 1 illustrates an example of such table.

TABLE 1

| Luminance signal relative value | Resistance value (Ω) | Voltage range (V) | Current range (A) |
| --- | --- | --- | --- |
| 0~10 | 1 | 0.01~0.1 | 0.01~0.1 |
| 10~100 | 0.1 | 0.01~0.1 | 0.1~1 |

Figure 3:
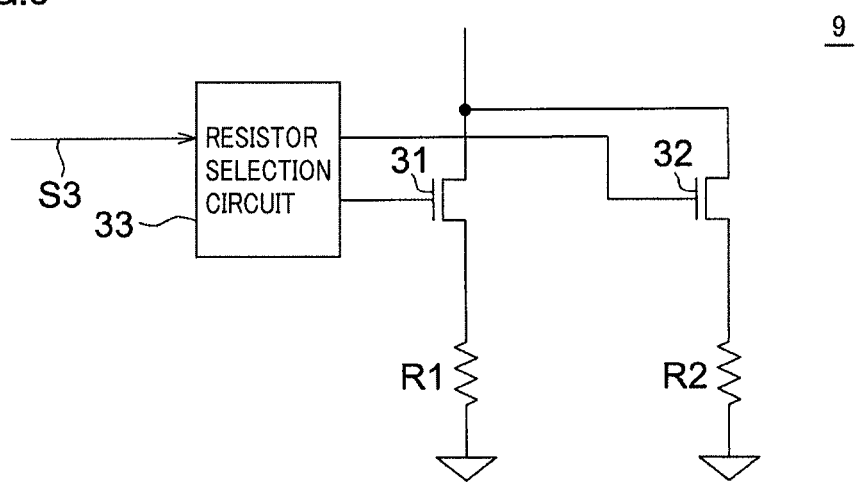
FIG. 3 is a circuit diagram showing the configuration of a current detection circuit.

FIG. 3 is a circuit diagram showing the configuration of current detection circuit 9. Current detection circuit 9 includes a plurality of resistors connected in parallel, and switching elements for determining which one of the plurality of resistors receives a current flow. Specifically, current detection circuit 9 includes two current detection resistors R1 an R2 connected in parallel, and MOSFETs 31 and 32 connected in series between organic EL element 2 and current detection resistors R1 an R2 respectively. MOSFETs 31 and 32 select one of current detection resistors R1 an R2. A resistor selection circuit 33 varies the gate voltages of MOSFETs 31 and 32 in response to resistor switching signal S3 from current control circuit 5, and performs control so that a current passes through one of current detection resistors R1 an R2. Current Ioled from organic EL element 2 passes as a drain D-source S current of MOSFET 31 or 32. Resistor selection circuit 33 is a circuit for varying the gate voltages of MOSFETs 31 and 32 and performing output selection (switching), and can be implemented by a known output selection circuit.

While the two current detection resistors are switched for use in current detection circuit 9 in this embodiment, three or more current detection resistors can be switched for use to attain a higher degree of energy savings. Moreover, while either one of two current detection resistors R1 an R2 is selected in the configuration described above, both of current detection resistors R1 an R2 can be selected and their combined resistance can be used to vary the resistance value.

In this embodiment, if the range of variation in current value is set from 10 to 1000 mA and the lowest accuracy for current detection signal S2 is set to 10 mV, for example, the resistance value is fixed at 1Ω when the current detection resistors are not switched, and a detected voltage varies from 10 mV to 1 V. In this case, maximum power as high as about 1 W is consumed at the current detection resistor. This is a very large value with respect to power of about 3.5 W which is consumed by organic EL element 2. In this embodiment, on the other hand, the range of variation in current value is set to 10 to 100 and 100 to 1000 where R1=1Ω and R2=0.1Ω are switched from each other, respectively, and current detection signal S2 of 10 to 100 mV is used. As such, the maximum power consumption is 0.1 W, thereby achieving low power consumption.

Second Embodiment

A second embodiment will be described. The second embodiment is described particularly with respect to a portion different from that in the first embodiment.

Figure 4:
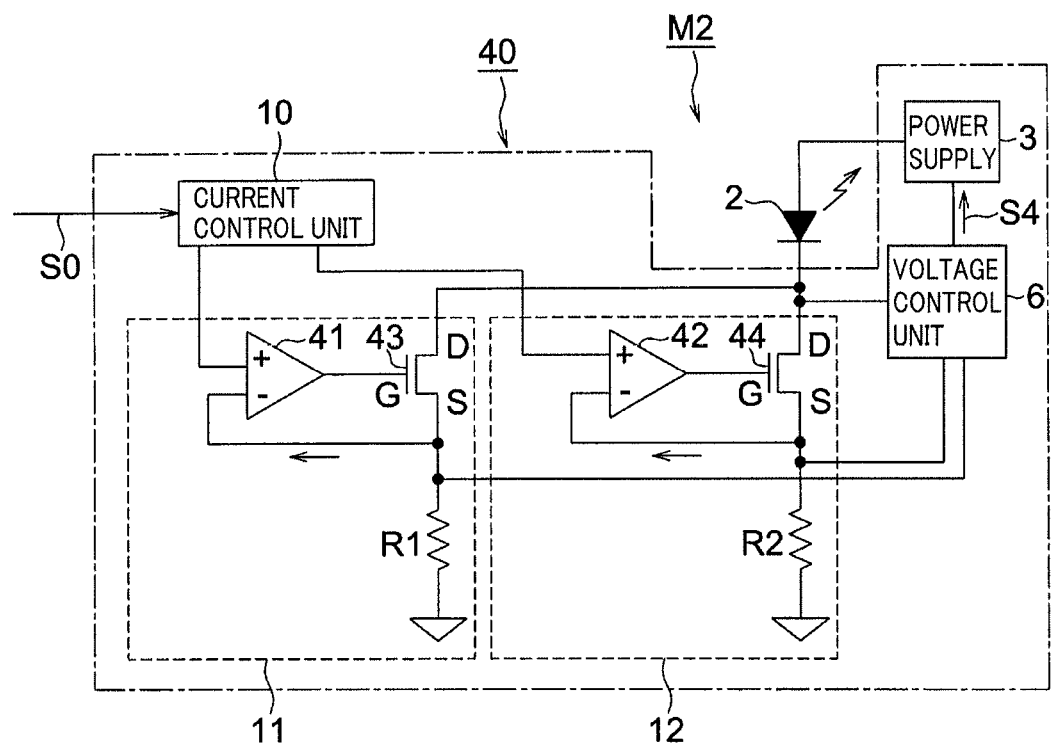
FIG. 4 shows the configuration of an organic EL lighting apparatus according to a second embodiment.

FIG. 4 shows the configuration of an organic EL lighting apparatus M2 according to the second embodiment. In this figure, a portion encircled with a chain-dotted line indicates an organic EL element driving device 40.

Organic EL lighting apparatus M2 according to the second embodiment is different from the first embodiment in that two current control circuits 11 and 12 controlled by a current control unit 10 are provided.

Current control circuit 11 includes a differential amplifier 41, a MOSFET 43 and current detection resistor R1, and current control circuit 12 includes a differential amplifier 42, a MOSFET 44 and current detection resistor R2. While there are two current control circuits in this embodiment, three or more current control circuits may be provided to attain a higher degree of energy savings.

While current detection resistors R1 and R2 are switched by resistor selection circuit 33 in the first embodiment, the differential amplifier, the MOSFET and the current detection resistor are switched together in the second embodiment. In this case, resistor selection circuit 33 is omitted and one of differential amplifiers 41 and 42 is selected instead by current control unit 10, to select one of current detection resistors R1 and R2 through which a current passes from organic EL element 2. That is, current control unit 10 that has received luminance control signal S0 determines an optimal one of the current detection resistors based on luminance control signal S0, and outputs a voltage to one of the current control circuits having the optimal current detection resistor. A current from organic EL element 2 passes through the selected one of the current control circuits. A voltage is not output to the not-selected one of the current control circuits, and therefore a current from organic EL element 2 does not pass through the not-selected one of the current control circuits.

Voltage control unit 6 controls power supply 3 by employing a voltage having a smaller potential.

Thus, in the second embodiment, one of the current control circuits is selected to select one of the current detection resistors. The operation subsequent to the resistor selection is similar to that in the first embodiment, and the description thereof is therefore not repeated. In the second embodiment, the current detection resistor itself forms the current detection circuit.

Thus, current control unit 10 includes the plurality of current control circuits 11 and 12 connected in parallel, which include MOSFETs 43 and 44 for controlling the value of a current passing through organic EL element 2, and current detection resistors R1 and R2 connected in series with MOSFETs 43 and 44, respectively. Current detection resistors R1 and R2 in the plurality of circuits have resistance values different from each other, and a determination is made about which one of the plurality of current control circuits 11 and 12 receives a current flow.

Another Embodiment

Figure 5:
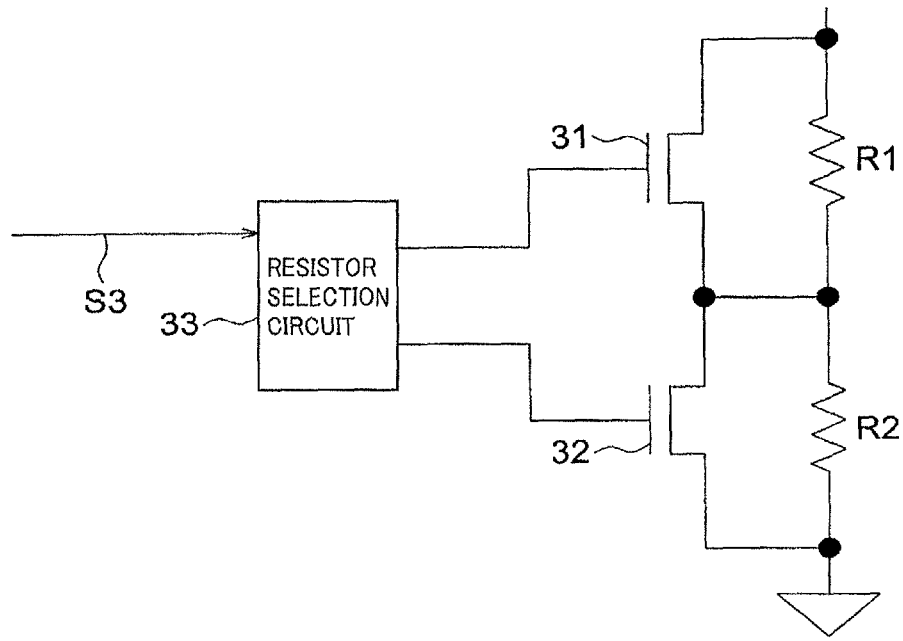
FIG. 5 is a circuit diagram showing another configuration of the current detection circuit.
Figure 5:
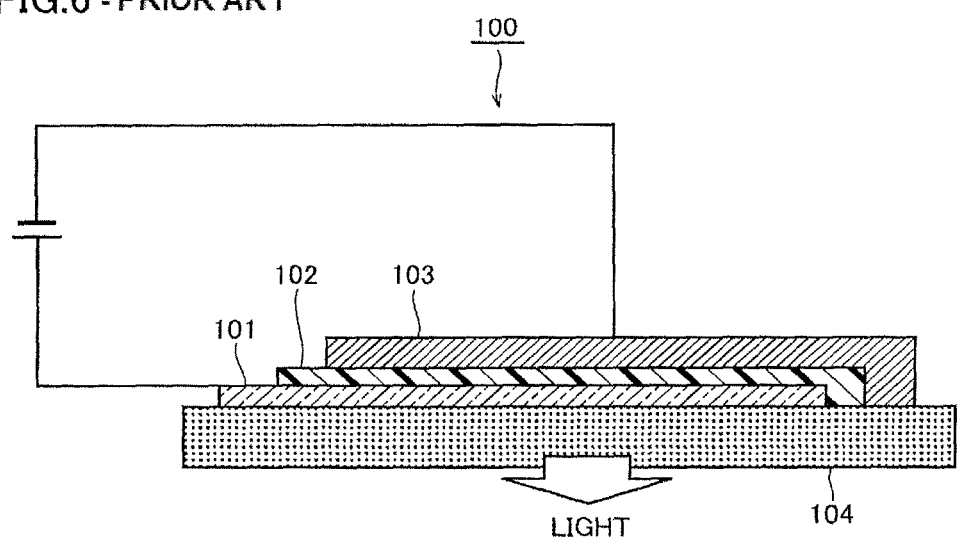

Other than the circuit shown in FIG. 3, a current detection circuit as shown in FIG. 5 can be employed, which includes a plurality of resistors connected in series, and a plurality of switching elements connected in parallel with the plurality of resistors, respectively, for determining which one of the plurality of resistors receives a current flow. Specifically, a current detection circuit 9# includes current detection resistors R1 and R2 connected in series, and MOSFETs 31 and 32 connected in parallel with current detection resistors R1 and R2, respectively. Current detection circuit 9# varies the gate voltage of MOSFETs 31 and/or 32, and selectively bypasses one of current detection resistors R1 and R2, to allow a current to pass only through the other resistor. Alternatively, selecting either one of two current detection resistors R1 and R2 and selecting both of current detection resistors R1 and R2 can be switched to vary the resistance value.

Each of the electrical detection circuits shown in FIGS. 3 and 5 forms a variable resistor for varying the resistance value of the current detection resistor as necessary.

Advantages

As described above, according to the embodiments discussed above, when controlling the value of the current passing through the organic EL element, the circuit constant of the current detection resistor or the like is variable in accordance with the value of the current. Therefore, an organic EL element driving device capable of attaining a higher degree of energy savings can be provided while a current detection system is maintained.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST

2, 100 organic EL element; 3, 202 power supply; 4, 10, 203 current control unit; 5, 11, 12, 204 current control circuit; 6 voltage control unit; 7, 41, 42 differential amplifier; 8, 31, 43, 44, 205 MOSFET; 9, 9# current detection circuit; 20, 40 organic EL element driving device; 33 resistor selection circuit; 101 ITO; 102 organic EL layer; 103 aluminum layer; 104 base member; 201, R, R2 current detection resistor; M1, M2 organic EL lighting apparatus.

The invention claimed is:

1. An organic EL element driving device that drives an organic EL element with a constant current and varies a value of said constant current in accordance with a luminance control for varying a luminance of said organic EL element, comprising:
    a power supply connected in series with said organic EL element, said power supply is a variable voltage source that varies an applied voltage;
    a voltage control unit that varies said applied voltage from said variable voltage source in accordance with said luminance control; and
    a current control unit connected in series with said organic EL element, wherein
    said current control unit comprises a current detection circuit comprising a plurality of resistors that detect a value of a current passing through said organic EL element,
    said current control unit varies and sets a prescribed value for said current to be passed through said organic EL element in accordance with said luminance which is varied by said luminance control, and performs control such that said current passing through said organic EL element has said prescribed value in accordance with an output from said current detection circuit, and
    a particular resistor in said plurality of resistors in said current detection circuit is selected, wherein said particular resistor has a resistance value which fits in with said detection of said value of said current which is set to pass through said organic EL element in accordance with said luminance control.

2. The organic EL element driving device according to claim 1, wherein
    said current control unit comprises a MOSFET arranged between said organic EL element and said current detection circuit, that controls said value of said current passing through said organic EL element.

3. The organic EL element driving device according to claim 1, wherein
    said plurality of resistors are connected in parallel, and
    said current detection circuit includes a switching element that determines whether said particular resistor receives a current flow.

4. The organic EL element driving device according to claim 1, wherein
    said plurality of resistors are connected in series, and
    said current detection circuit comprises a plurality of switching elements connected in parallel with said plurality of resistors, respectively, that determine whether said particular resistor receives a current flow.

5. An organic EL lighting apparatus comprising:
    an organic EL element; and
    an organic EL element driving device that drives said organic EL element with a constant current and varies a value of said constant current in accordance with a luminance control for varying a luminance of said organic EL element, comprising:
- a power supply connected in series with said organic EL element, said power supply is a variable voltage source that varies an applied voltage;
- a voltage control unit that varies said applied voltage from said variable voltage source in accordance with said luminance control; and
  - a current control unit connected in series with said organic EL element, wherein
  - said current control unit comprises a current detection circuit comprising a plurality of resistors that detect a value of a current passing through said organic EL element,
  - said current control unit varies and sets a prescribed value for said current to be passed through said organic EL element in accordance with said luminance which is varied by said luminance control, and performs control such that said current passing through said organic EL element has said prescribed value in accordance with an output from said current detection circuit, and
  - a particular resistor in said plurality of resistors in said current detection circuit is selected, wherein said particular resistor has a resistance value which fits in with said detection of said value of said current which is set to pass through said organic EL element in accordance with said luminance control.

6. The organic EL lighting apparatus according to claim 5, wherein
said current control unit comprises a MOSFET arranged between said organic EL element and said current detection circuit, that controls said value of said current passing through said organic EL element.

7. The organic EL lighting apparatus according to claim 5, wherein
said plurality of resistors are connected in parallel, and
said current detection circuit comprises a switching element that determine whether said particular resistor receives a current flow.

8. The organic EL lighting apparatus according to claim 5, wherein
said plurality of resistors are connected in series, and
said current detection circuit comprises a plurality of switching elements connected in parallel with said plurality of resistors, respectively, that determine whether said particular resistor receives a current flow.

9. An organic EL element driving device that drives an organic EL element with a constant current and varies a value of said constant current in accordance with a luminance control for varying a luminance of said organic EL element, comprising:
- a power supply connected in series with said organic EL element;
- a current control unit connected in series with said organic EL element; and
- a plurality of current control circuits connected in parallel, controlled by said current control unit, wherein
each of said plurality of current control circuits comprises a MOSFET for controlling a value of a current passing through said organic EL element, and a current detection circuit comprising a resistor, connected in series with said MOSFET, for detecting said value of said current passing through said organic EL element,
said current control unit varies and sets a prescribed value for said current to be passed through said organic EL element in accordance with said luminance which is varied by said luminance control, and performs control such that said current passing through said organic EL element has said prescribed value in accordance with a selected output from said current detection circuit,
a resistance value of said resistor in any one of said plurality of current control circuits is different from a resistance value of any other of said resistors in any other of said plurality of current control circuits, and a particular resistor in a particular current detection circuit in said plurality of current control circuits is selected, wherein said particular resistor has a resistance value which fits in with said detection of said value of said current which is set to pass through said organic EL element in accordance with said luminance control by determining as to which one of said plurality of current control circuits receives a current flow.

10. The organic EL element driving device according to claim 9, wherein said power supply is a variable voltage source that varies an applied voltage, and
said driving device further comprises a voltage control unit for varying said applied voltage from said power supply in accordance with said luminance control.

11. The organic EL element driving device according to claim 9, wherein
in each of said current control circuits, said MOSFET is arranged between said organic EL element and said resistor of said respective current detection circuit.

12. An organic EL lighting apparatus comprising:
- an organic EL element; and
- an organic EL element driving device that drives said organic EL element with a constant current and varies a value of said constant current in accordance with a luminance control for varying a luminance of said organic EL element, comprising:
  - a power supply connected in series with said organic EL element;
  - a current control unit connected in series with said organic EL element; and
  - a plurality of current control circuits connected in parallel, controlled by said current control unit, wherein
  each of said plurality of current control circuits comprises a MOSFET for controlling a value of a current passing through said organic EL element, and a current detection circuit comprising a resistor, connected in series with said MOSFET, for detecting said value of said current passing through said organic EL element,
  said current control unit varies and sets a prescribed value for said current to be passed through said organic EL element in accordance with said luminance which is varied by said luminance control, and performs control such that said current passing through said organic EL element has said prescribed value in accordance with a selected output from said current detection circuit,
  a resistance value of said resistor in any one of said plurality of current control circuits is different from a resistance value of any other of said resistors in any other of said plurality of current control circuits, and a particular resistor in a particular current detection circuit in said plurality of current control circuits is selected, wherein said particular resistor has a resistance value which fits in with said detection of said value of said current which is set to pass through said organic EL element in accordance with said luminance control by determining as to which one of said plurality of current control circuits receives a current flow.

13. The organic EL lighting apparatus according to claim 12, wherein
   said power supply is a variable voltage source that varies an applied voltage, and
   said driving device further comprises a voltage control unit for varying said applied voltage from said power supply in accordance with said luminance control.

14. The organic EL lighting apparatus according to claim 12, wherein
   in each of said current control circuits, said MOSFET is arranged between said organic EL element and said resistor of said respective current detection circuit.

* * * * *